(12) United States Patent
Cha et al.

(10) Patent No.: US 7,622,311 B1
(45) Date of Patent: Nov. 24, 2009

(54) INSPECTION OF UNDERFILL IN INTEGRATED CIRCUIT PACKAGE

(75) Inventors: Keng Sang Cha, Penang (MY); Tek Seng Tan, Penang (MY); Haris Fazelah, Penang (MY); Ahmad Zahrain B. Mohamad Shakir, Penang (MY)

(73) Assignee: Advanced Micro Devices, Inc., Austin, TX (US)

( * ) Notice: Subject to any disclaimer, the term of this patent is extended or adjusted under 35 U.S.C. 154(b) by 463 days.

(21) Appl. No.: 11/290,086

(22) Filed: Nov. 30, 2005

(51) Int. Cl.
*H01L 21/66* (2006.01)

(52) U.S. Cl. .............. 438/16; 438/15; 438/26; 438/127; 700/109; 700/110; 257/687; 257/E23.116; 257/E23.123; 257/E23.129

(58) Field of Classification Search ........ 700/109, 700/110; 438/15, 16, 26, 106, 127; 257/678, 257/687, E33.056, E23.001, E23.116, E23.123, 257/E23.129
See application file for complete search history.

(56) References Cited

U.S. PATENT DOCUMENTS 6,274,389 B1 * 8/2001 Iida et al. .............. 438/4
6,650,022 B1 * 11/2003 Qi et al. .............. 257/797
2007/0069041 A1 * 3/2007 Quinones et al. .............. 239/71

FOREIGN PATENT DOCUMENTS

JP 2006286744 * 10/2006

OTHER PUBLICATIONS

Machine translation of Specification of JP2006/286744. Human translation requested and will be provided in a later office action.*

* cited by examiner

*Primary Examiner*—Matthew C Landau
*Assistant Examiner*—Colleen E Snow
(74) *Attorney, Agent, or Firm*—Monica H. Choi

(57) ABSTRACT

In inspecting for quality of underfill material dispensed in an IC package, a camera image is captured for the IC package having the underfill material dispensed between an IC die and a package substrate. A data processor analyzes the camera image to determine an occurrence of an unacceptable condition of the underfill material. Pre-heating and/or post-heating of the package substrate before and/or after dispensing the underfill material by a contact-less heater ensures uniform spreading of the underfill material.

22 Claims, 7 Drawing Sheets

INSPECTION OF UNDERFILL IN INTEGRATED CIRCUIT PACKAGE

TECHNICAL FIELD

The present invention relates generally to integrated circuit (IC) manufacture, and more particularly, to inspection of underfill material dispensed in an IC package.

BACKGROUND OF THE INVENTION

FIG. 1 shows a cross-sectional view of an IC package 100, such as a flip-chip IC package for example. The IC package 100 of FIG. 1 includes a package substrate 102 that supports pins 104 for providing electrical coupling to nodes of an integrated circuit die 106. Contact balls 108 and contact pads 110 on the substrate 102 couple such nodes of the integrated circuit die 106 to the pins 104 of the substrate 102.

In addition, an underfill material 112 is dispensed between the IC die 106 and the package substrate 102. The underfill material 112 is comprised of an insulating material and is desired to surround the contact balls 108 and the contact pads 110 for ensuring reliability of the IC package 100.

Referring to FIG. 2, an unacceptable condition of the underfill material 112 is if portions of such underfill material 112 are disposed on the IC die 106 or the substrate 102 to form contamination 114 and 116. Such contamination 114 and 116 of the IC package 100 may cause the IC package 100 to become inoperative.

Referring to FIG. 3, another unacceptable condition of the underfill material 112 is if a surface 118 of the underfill material 112 does not extend to completely surround the periphery sidewalls of the die 106 and the top surface of the substrate 102 around the outside of the die 106. Such insufficient coverage with the underfill material 112 may cause reliability issues for the IC package 100.

Thus, a mechanism is desired for effectively and efficiently detecting for such unacceptable conditions of the underfill material 112.

SUMMARY OF THE INVENTION

Accordingly, the present invention captures a camera image that is analyzed by a data processor to effectively and efficiently inspect the underfill material dispensed in an IC package.

In inspecting for quality of underfill material dispensed in an IC package, a camera image is captured for the IC package having the underfill material dispensed between an IC die and a package substrate. In addition, a data processor analyzes the camera image to determine an occurrence of an unacceptable condition of the underfill material.

In one embodiment of the present invention, the camera image is a top view of the IC die placed onto the package substrate. In that case, the data processor detects for a portion of the underfill material forming a contamination on the IC die or the package substrate. Alternatively, the data processor determines a fillet width of the underfill material from the captured image, and the data processor determines a height of an underfill fillet from correlation to the fillet width. In that case, the data processor provides a warning when the height of the underfill fillet is not within an acceptable range. In addition, the data processor controls a conveyor carrying the IC package to be stopped until an operator removes the IC package having the unacceptable condition of the underfill material.

In another embodiment of the present invention, the IC package is disposed on the conveyor that is moved as the camera image is captured.

In a further embodiment of the present invention, the IC package is positioned at a tilted angle with respect to a vertical axis of a camera, and the camera image of a side of the IC package is captured with the camera. In an example embodiment of the present invention, the tilted angle is about 15°. The data processor determines a height of an underfill fillet from the camera image of the side of the IC package. For example, the data processor determines the height of the underfill fillet from a color contrast between the underfill fillet and the IC die in the camera image of the side of the IC package.

In such a case also, the data processor provides a warning when the height of the underfill fillet is not within an acceptable range. In addition, the data processor may provide data of the height of the underfill fillet for a plurality of IC packages.

In a method and system for dispensing underfill material in an IC package according to another embodiment of the present invention, an IC die is coupled to a package substrate of the IC package. In addition, the underfill material is thereafter dispensed between the IC die and the package substrate. Furthermore, at least one of pre-heating or post-heating of the package substrate is performed with contact-less heating before or after the dispensing of the underfill material. In one example embodiment of the present invention, hot air is blown toward the package substrate for the pre-heating and/or post-heating.

Such pre-heating and/or post-heating ensure uniform spreading of the underfill material between the IC die and the package substrate to ensure that the underfill material completely surrounds the contact balls and the contact pads. In this manner, the underfill material is ensured to be dispensed properly.

BRIEF DESCRIPTION OF THE DRAWINGS

These and other features and advantages of the present invention will be better understood by considering the following detailed description of the invention which is presented with the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, and 14 refer to elements having similar structure and/or function.

DETAILED DESCRIPTION

Figure 1:
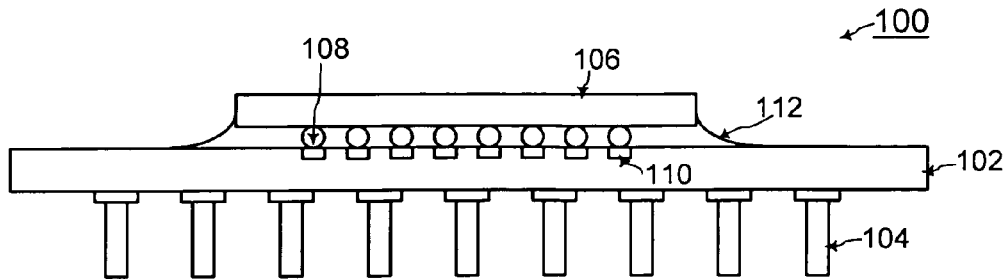
FIG. 1 shows a cross-sectional view of a flip-chip IC package.
Figure 2:
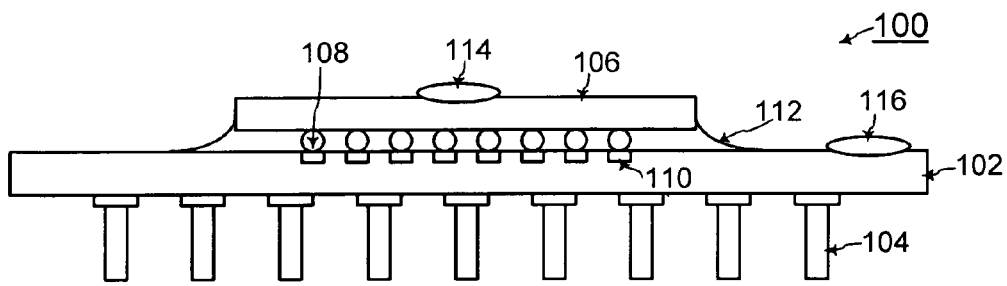
FIGS. 2 and 3 show cross-sectional views with unacceptable conditions of the underfill material in the flip-chip IC package.
Figure 3:
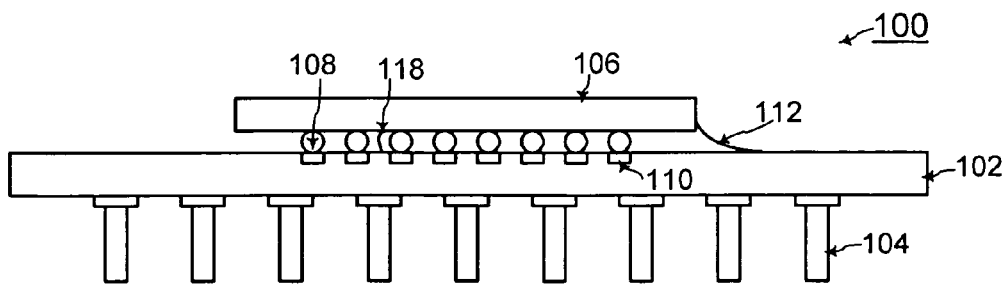
Figure 4:
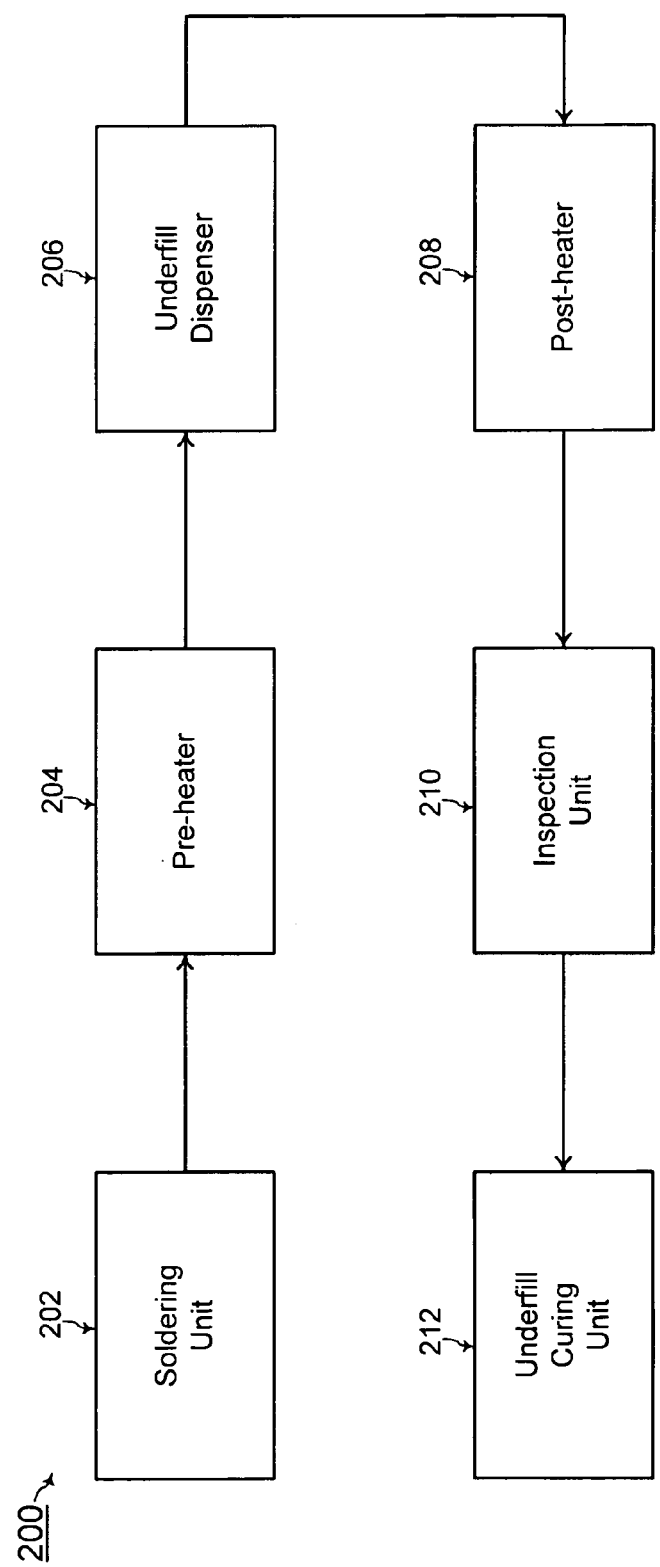
FIG. 4 shows a block diagram of a system for properly dispensing underfill material in an IC package, according to an embodiment of the present invention.
Figure 5:
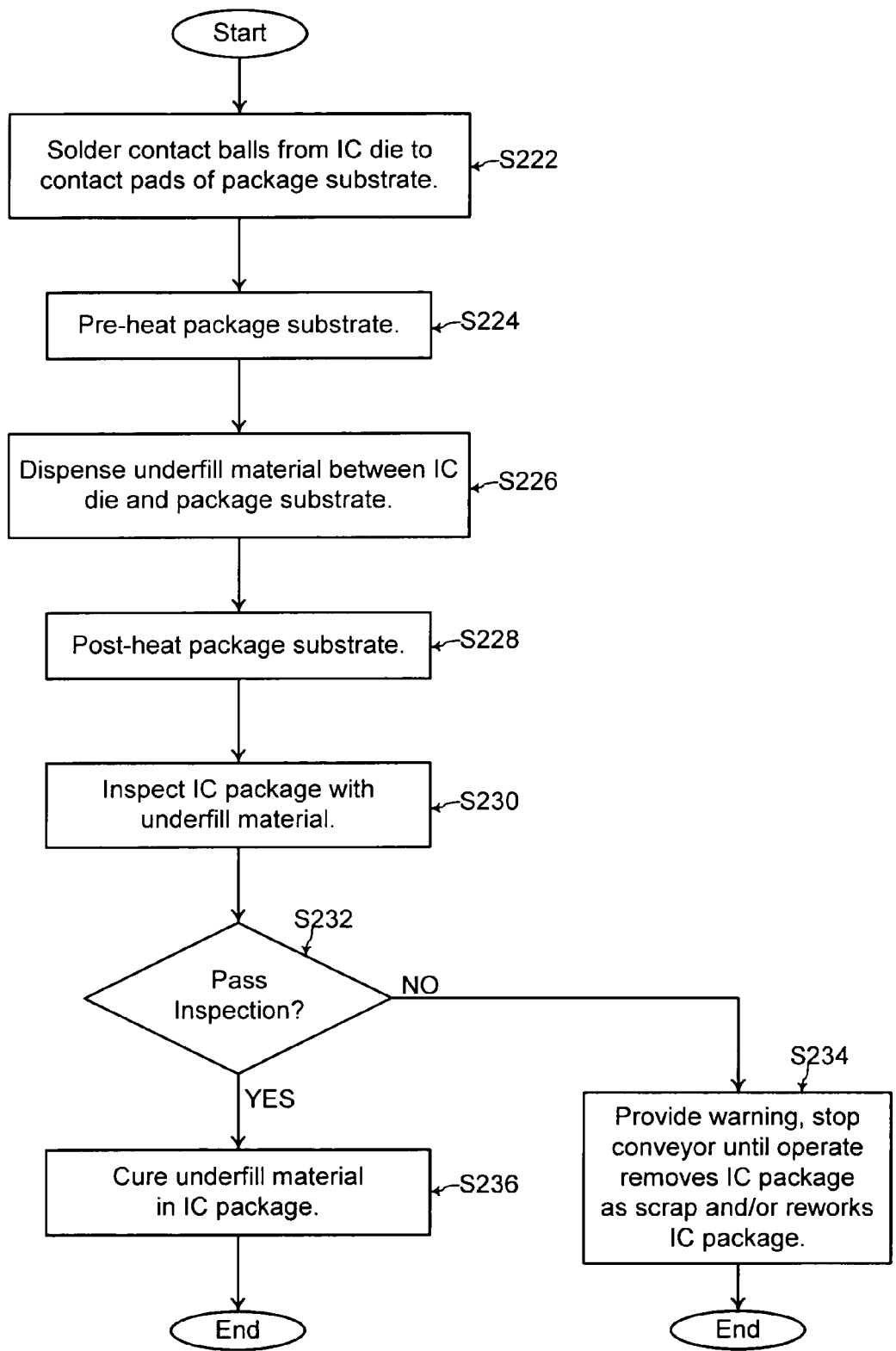
FIG. 5 shows a flow-chart of steps during operation of the system of FIG. 4, according to an embodiment of the present invention.

FIG. 4 shows a system 200 for properly dispensing underfill material during manufacture of an IC package. The system 200 includes a soldering unit 202, a pre-heater 204, an underfill dispenser 206, a post-heater 208, an inspection unit 210, and an underfill curing unit 212. FIG. 5 shows a flow-chart of steps during operation of the system 200 of FIG. 4.

Figure 6:
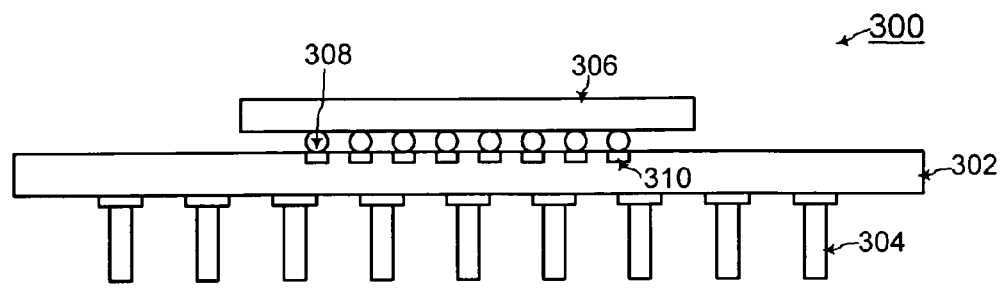
FIG. 6 shows a cross-sectional view of a flip-chip IC package before dispensing underfill material, according to an embodiment of the present invention.

FIG. 6 shows an example IC package 300, such as a flip-chip IC package for example, processed through the system 200 of FIG. 4. The IC package 300 of FIG. 6 includes a package substrate 302 that supports pins 304 for providing electrical coupling to nodes of an integrated circuit (IC) die 306. Contact balls 308 and contact pads 310 on the substrate 302 couple such nodes of the integrated circuit die 306 to the pins 304 of the substrate 302.

The soldering unit 202 couples the contact balls 308 from the IC die 306 to the contact pads 310 of the substrate 302. For example, the contact balls 308 are soldered to the contact pads 310 of the substrate 302 in the soldering unit 202 (step S222 in FIG. 5). Such a soldering unit 202 is individually known to one of ordinary skill in the art.

Figure 7:
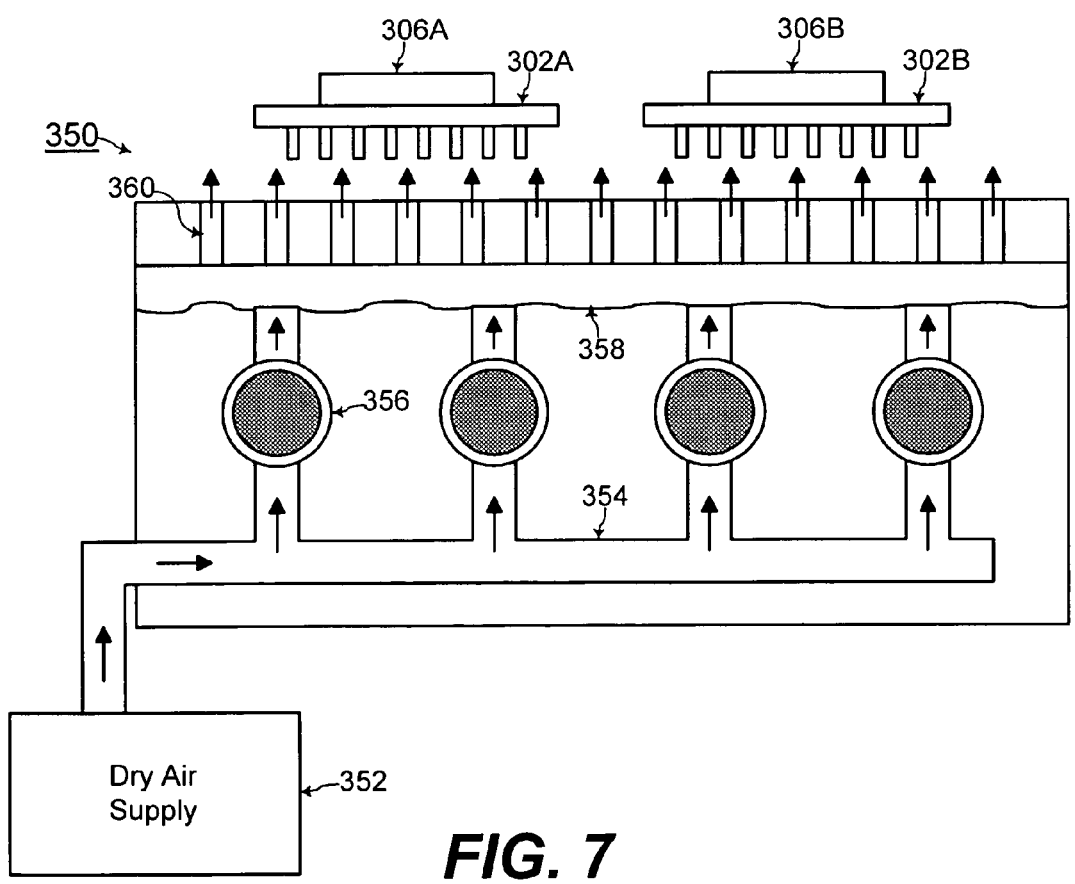
FIG. 7 shows a block diagram of a contact-less heater for pre-heating or post-heating a package substrate of the IC package before or after dispensing the underfill material, according to an embodiment of the present invention.

Thereafter, the package substrate 302 is heated in the pre-heater 204 (step S224 of FIG. 5). In one embodiment of the present invention, the pre-heater 204 is a contact-less heater 350 as illustrated in FIG. 7. Referring to FIG. 7, the contact-less heater 350 includes a dry air supply 352 that blows dry air (i.e., air without moisture) through an air vent 354. The contact-less heater 350 also includes heating elements 356 that are heated in the path of the air vent 354 to create a hot air jet 358.

In addition, the contact-less heater 350 includes air holes 360 for directing hot air toward package substrates 302A and 302B of IC packages. FIG. 7 shows a first IC package with an IC die 306A and the package substrate 302A, and a second IC package with an IC die 306B and the package substrate 302B.

Figure 8:
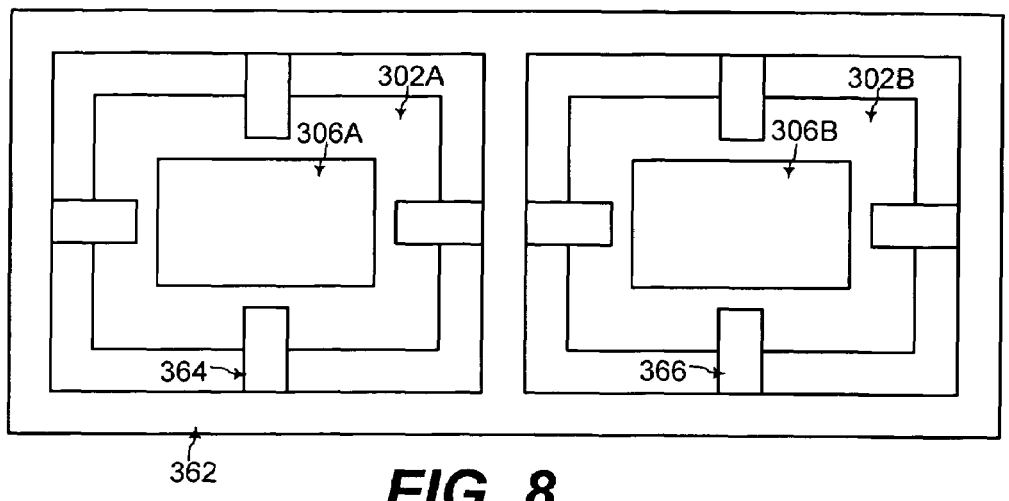
FIG. 8 shows a top view of a holder for holding IC packages in the contact-less heater of FIG. 7, according to an embodiment of the present invention.

FIG. 8 shows a top view of a holder 362 that may be used in the contact-less heater 350 for holding the IC packages while hot air is blown thereon. The holder 362 includes a first set of clips 364 for holding the package substrate 302A of the first IC package while hot air is blown thereon in the contact-less heater 350. Similarly, the holder 362 includes a second set of clips 366 for holding the package substrate 302B of the second IC package while hot air is blown thereon in the contact-less heater 350.

In this manner, the contact-less heater 350 blows hot air toward the package substrates of the IC packages to heat up such package substrates. Heating of the package substrates of the IC packages does not depend on any contact of such package substrates to the contact-less heater 350. In addition, the holder 362 of FIG. 8 holds the package substrates of the IC packages irrespective of any pin configuration under the package substrates. Thus, the contact-less heater 350 effectively heats the package substrates of the IC packages irrespective of any pin configuration under the package substrates.

Figure 9:
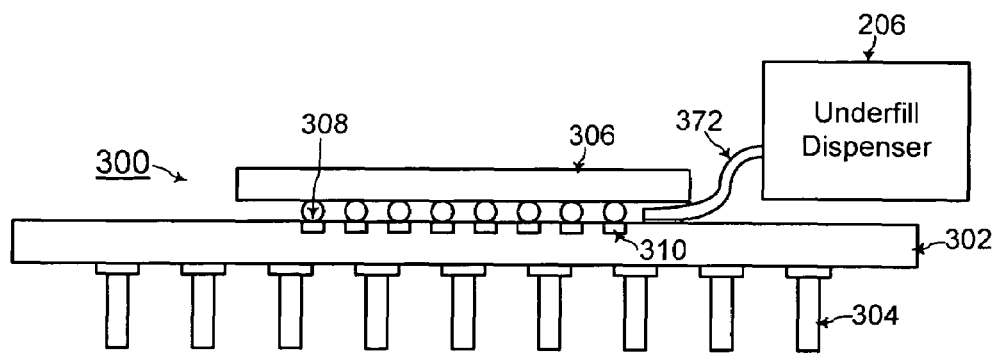
FIG. 9 shows a block diagram of an underfill dispenser, according to an embodiment of the present invention.

In one embodiment of the present invention, the pre-heater 204 in the system 200 of FIG. 4 is implemented as the contact-less heater 350 of FIG. 7. After such pre-heating, the underfill dispenser 206 dispenses underfill material within the IC package 300 (step S226 of FIG. 5). FIG. 9 shows a tubing 372 from an underfill dispenser 206 for directing the underfill material between the IC die 306 and the package substrate 302.

Figure 10:
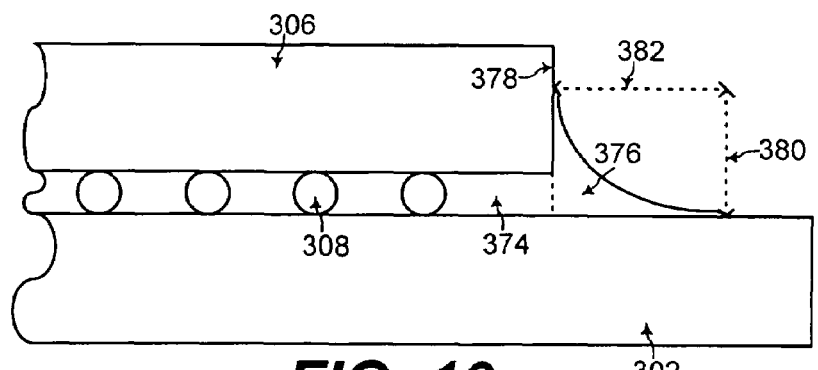
FIG. 10 shows an enlarged view of the underfill fillet formed to a sidewall of the IC die, according to an embodiment of the present invention.

Referring to FIG. 10, for effective dispensing of underfill material 374 between the IC die 306 and the package substrate 302, the underfill material 374 should form an underfill fillet 376 at each sidewall 378 of the IC die 306. Such an underfill fillet 376 is characterized by a height 380 up along the sidewall 378 of the IC die 306, and by a fillet width 382 onto the package substrate 302 outside the sidewall 378 of the IC die 306.

After the underfill material 374 is dispensed from the dispenser 206, the post-heater 208 heats the package substrate 302 (step S228 in FIG. 5). In one embodiment of the present invention, the post-heater 208 is implemented as the contact-less heater 350 of FIG. 7 for contact-less heating of the package substrate 302.

Such pre-heating of the substrate 302 by the pre-heater 204 before the underfill material 374 is dispensed and such post-heating of the substrate 302 by the post-heater 208 after the underfill material 374 is dispensed further ensure uniform spreading of the underfill material 374 between the IC die 306 and the substrate 302. The present invention may be practiced with one or both of such pre-heating and post-heating of the package substrate 302.

Figure 11:
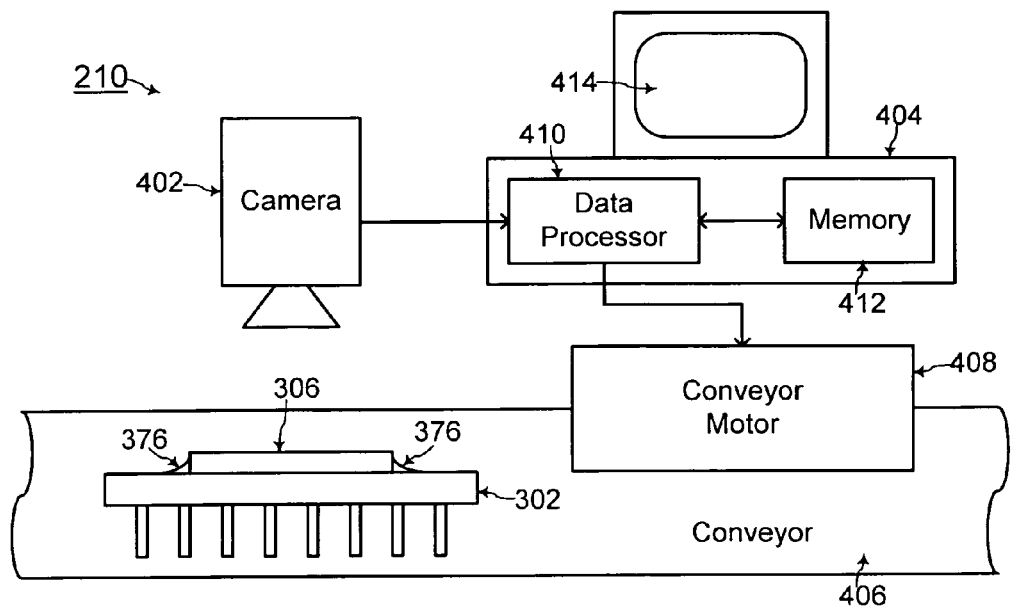
FIG. 11 shows a block diagram of an underfill inspection unit, according to an embodiment of the present invention.

Referring to FIG. 4, after the post-heating, the inspection unit 210 is used to detect for any unacceptable condition of the underfill material 374 (step S230 of FIG. 5). FIG. 11 shows components of the inspection unit 210, according to one embodiment of the present invention. The inspection unit 210 includes a camera 402 and a computer system 404. The camera 402 captures a camera image of the IC package 300 having the package substrate 302, the IC die 306, and the underfill fillet 376 at the sidewalls of the IC die 306.

In one embodiment of the present invention, the camera captures the image of the IC package 300 that is moving on a conveyor 406. A conveyor motor 408 controls movement of the conveyor 406. The computer system 404 includes a data processor 410, a memory device 412, and a display unit 414.

Figure 12:
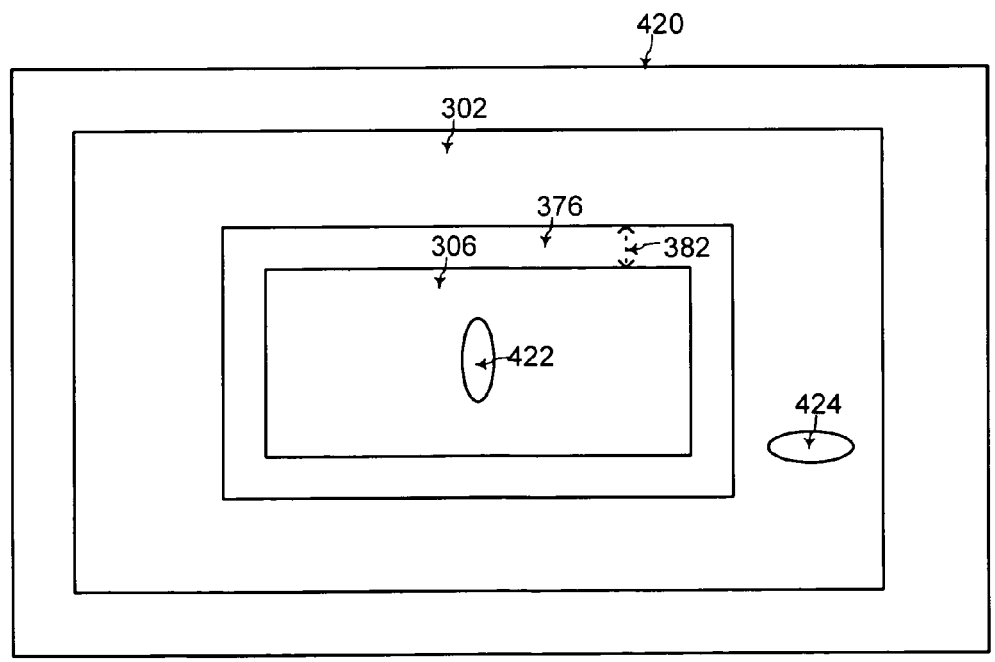
FIG. 12 shows an example top view of the IC package captured by the underfill inspection unit of FIG. 11, according to an embodiment of the present invention.

For inspection of the underfill material of the IC package 300, the camera 402 captures the image of the IC package 300 such as a top view image 420 of the IC package 300 in FIG. 12. Such an image is input by the data processor 410 of the computer system 404. The data processor 410 analyzes the top view image 420 to determine the fillet width 382 of the underfill fillet 376. For example, the area of the underfill fillet 376 may have a distinctive color contrast in the image 420, and the data processor 410 determines the distance 382 as the fillet width 382 in the top view image 420.

In addition, referring to FIGS. 10 and 12, the data processor 410 determines the height 380 of the underfill fillet 376 from correlation of such height 380 to the fillet width 382. The data processor 410 then determines whether such a height 380 of the underfill fillet 376 is within an acceptable range to pass inspection (step S232 of FIG. 5). If the height 380 of the underfill fillet 376 is within the acceptable range to pass inspection, the IC package 300 is passed to the underfill curing unit 212 for curing the underfill material in the IC package 300 (step S236 of FIG. 5).

On the other hand, if the height 380 of the underfill fillet 376 is not within the acceptable range to fail inspection, the data processor 410 provides a warning to an operator such as on the display unit 414 of the computer system for example (step S234 of FIG. 5). In addition, the data processor 410 controls the conveyor motor 408 to stop the conveyor 406 from moving the IC package 300 to the underfill curing unit. Furthermore, the data processor 410 waits until the operator inputs an indication to the data processor 410 that the IC package 300 failing inspection has been removed as scrap from the conveyor 406 or that the IC package 300 has been reworked.

Furthermore, the data processor 410 also analyzes the top view image 420 to find any contaminations 422 and/or 424. The contamination 422 is formed by a portion of the underfill material 374 being on the IC die, and the contamination 424 is formed by a portion of the underfill material 374 being on the package substrate 302. When the data processor 410 determines presence of any unacceptable contamination on the IC die 306 and/or the package substrate 302, the data processor 410 determines the IC package 300 to fail inspection and performs step S234 in FIG. 5.

The memory device 412 of the computer system 404 has sequences of instructions stored thereon that when executed by the data processor 410 causes the data processor 410 to perform the above described functions. In this manner, the underfill material 374 of the IC package 300 is ensured to be spread uniformly between the IC die 306 and the package substrate 302 to surround the contact balls 308 and the contact pads 310. In addition, the underfill material 374 is effectively and efficiently inspected during manufacture of the IC package 300.

Figure 13:
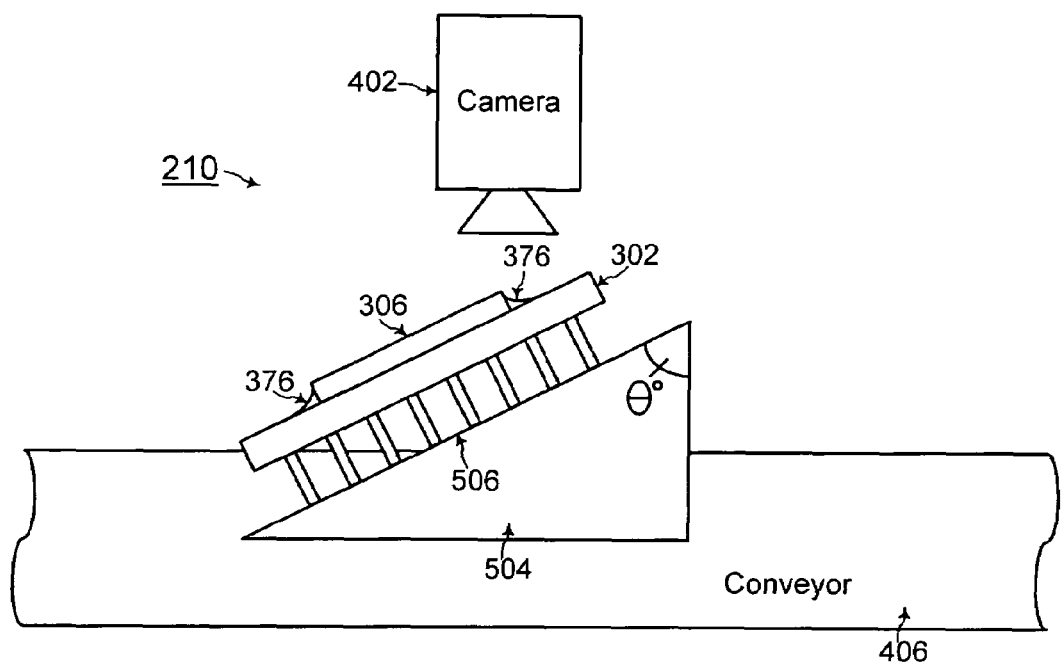
FIG. 13 shows further components in the underfill inspection unit of FIG. 11, according to another embodiment of the present invention.
Figure 14:
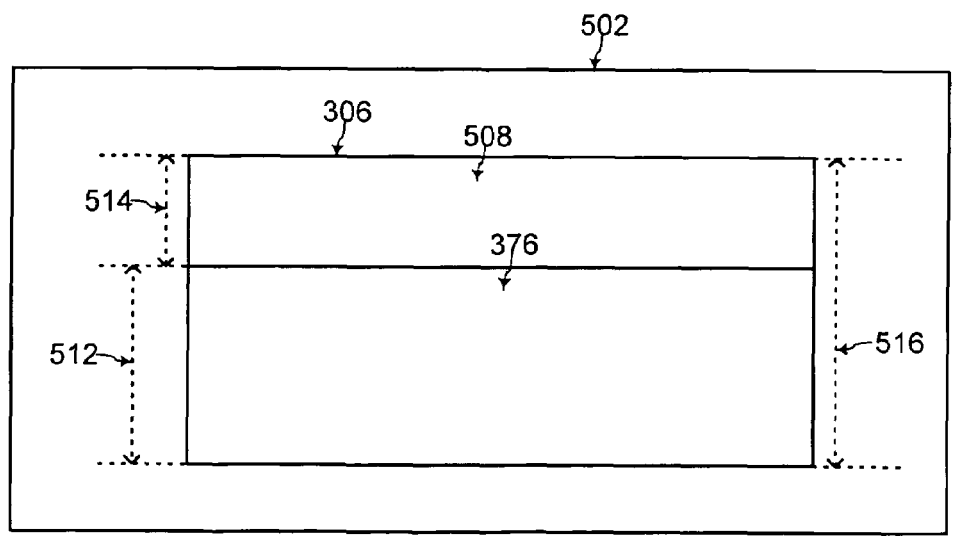
FIG. 14 shows a side view of the IC package captured using the components of FIG. 13, according to another embodiment of the present invention.

In another embodiment of the present invention, FIG. 13 shows additional components in the inspection unit 210 for capturing a side view image 502 of IC package 300 in FIG. 14. In FIG. 13, the inspection unit 210 includes a jig 504 having a tilted surface 506. The surface 506 is tilted to be at an angle of θ° with respect to a vertical axis of the camera 402. The vertical axis of the camera 402 is the axis for the line of sight of the camera 402. In one embodiment of the present invention, the tilt angle θ° is about 15°.

Further referring to FIG. 13, the IC package 300 is placed onto the tilted surface 506 with the pins down onto the surface 506. Referring to FIGS. 13 and 14, the camera 402 then captures an image at the area of the underfill fillet 376 at a sidewall 508 of the IC die 306 facing up toward the camera 402.

Such a side view image 502 is input and analyzed by the data processor 410 to determine a height 512 of the underfill fillet 376. An exposed portion of the sidewall 508 of the IC die 306 has a different color from the underfill fillet 376 in the side view image 502. The data processor 410 uses such color contrast to determine a height 514 of the exposed portion of the sidewall 508 of the IC die 306. If a total height 516 of the sidewall 508 of the IC die 306 is known, the height 512 of the underfill fillet 376 may be determined from the difference from such a total height 516 and the height 514 of the exposed portion of the sidewall 508 of the IC die 306.

In addition, the data processor 410 may account for the tilt angle θ° of the surface 506 in determining the height 512 of the underfill fillet 376. After such determination of the height of the underfill fillet 376 from the side view image 502, the data processor determines whether such a height 512 is within an acceptable range to pass inspection (step S232 of FIG. 5). The computed data may be stored to tabulate the quality of the underfill fillet 376. If the height 512 is within the acceptable range to pass inspection, such a result indicates that the quality of the underfill fillet 376 is within specification requirements and within acceptable process control. Such computed data may also be used for comparing the quality of alternative underfill processes.

On the other hand, if the height 512 is not within the acceptable range to fail inspection, the data processor 410 provides a warning to an operator such as on the display unit 414 of the computer system. The computed data may be outputted to the operator to reflect the quality of the fillet height 512.

The foregoing is by way of example only and is not intended to be limiting. For example, the present invention is described for the flip-chip IC package. However, the present invention may also similarly be applied for other types of IC packages. In addition, any materials or number of elements shown or described herein are by way of example only.

We claim:

1. A method of inspecting for quality of underfill material dispensed in an IC (integrated circuit) package, comprising:
generating a camera image of the IC package having the underfill material dispensed between an IC die and a package substrate;
analyzing, by a data processor, the camera image of an underfill fillet formed to a sidewall of the IC die to determine an occurrence of an unacceptable condition of the underfill material;
determining by the data processor a fillet width of said underfill fillet from the camera image; and
determining by the data processor a height of the underfill fillet along the sidewall of the IC die from the fillet width.

2. The method of claim 1, wherein the camera image is a top view of the IC die placed onto the package substrate.

3. The method of claim 2, wherein the data processor detects for a portion of the underfill material forming a contamination on the IC die or the package substrate.

4. The method of claim 1, wherein the data processor provides a warning when the height of the underfill fillet is not within an acceptable range.

5. The method of claim 1, wherein the data processor controls a conveyor carrying the IC package to be stopped until an operator removes the IC package having the unacceptable condition of the underfill material.

6. The method of claim 1, wherein the IC package is disposed on a conveyor that is moved as the camera image is captured.

7. A method of inspecting for quality of underfill material dispensed in an IC (integrated circuit) package, comprising:
generating a camera image of the IC package having the underfill material dispensed between an IC die and a package substrate;
analyzing, by a data processor, the camera image to determine an occurrence of an unacceptable condition of the underfill material;
positioning the IC package at a tilted angle with respect to a vertical axis of a camera; and
capturing the camera image of a side of the IC package with the camera.

8. The method of claim 7, wherein the tilted angle is about 15°.

9. The method of claim 7, further comprising:
determining by the data processor a height of an underfill fillet from the camera image of the side of the IC package.

10. The method of claim 9, further comprising:
determining by the data processor the height of the underfill fillet from a color contrast between the underfill fillet and the IC die in the camera image of the side of the IC package.

11. The method of claim 10, wherein the data processor provides a warning when the height of the underfill fillet is not within an acceptable range.

12. The method of claim 10, wherein the data processor controls a conveyor carrying the IC package to be stopped until an operator removes the IC package having the height of the underfill fillet not within the acceptable range.

13. The method of claim 7, further comprising:
heating the package substrate of the IC package before and after the underfill material is dispensed and before the camera image is captured.

14. The method of claim 13, wherein the package substrate of the IC package is heated by contact-less heating.

15. The method of claim 14, wherein the package substrate of the IC package is heated by blowing hot air toward the package substrate.

16. The method of claim 7, wherein the camera image is a top view of the IC die placed onto the package substrate.

17. The method of claim 16, wherein the data processor detects for a portion of the underfill material forming a contamination on the IC die or the package substrate.

18. The method of claim 16, wherein the data processor determines a fillet width of the underfill material from the captured image.

19. The method of claim 18, wherein the data processor determines a height of an underfill fillet from correlation to the fillet width.

20. The method of claim 19, wherein the data processor provides a warning when the height of the underfill fillet is not within an acceptable range.

21. The method of claim 7, wherein the data processor controls a conveyor carrying the IC package to be stopped until an operator removes the IC package having the unacceptable condition of the underfill material.

22. The method of claim 7, wherein the IC package is disposed on a conveyor that is moved as the camera image is captured.

* * * * *